United States Patent [19]

Mahmoud

[11] Patent Number: 4,898,651

[45] Date of Patent: Feb. 6, 1990

[54] ANODIC COATINGS ON ALUMINUM FOR CIRCUIT PACKAGING

[75] Inventor: Issa S. Mahmoud, Austin, Tex.

[73] Assignee: International Business Machines Corporation, Armonk, N.Y.

[21] Appl. No.: 398,680

[22] Filed: Aug. 25, 1989

Related U.S. Application Data

[62] Division of Ser. No. 145,805, Jan. 15, 1988.

[51] Int. Cl.$^4$ .............................................. C25D 11/08
[52] U.S. Cl. ...................................... 204/29; 204/33; 204/376; 204/58
[58] Field of Search ..................... 204/29, 33, 37.6, 58

[56] References Cited

U.S. PATENT DOCUMENTS

| | | | |
|---|---|---|---|
| 3,935,349 | 1/1976 | Terai et al. | 427/409 |
| 3,985,629 | 10/1976 | Kimura | 204/58 |
| 4,406,757 | 9/1983 | Huang | 204/58 |
| 4,439,287 | 3/1984 | Birkle et al. | 204/58 |
| 4,478,689 | 10/1984 | Loch | 204/14.1 |
| 4,481,083 | 11/1984 | Ball et al. | 204/38.3 |
| 4,507,179 | 3/1985 | Yoshida et al. | 204/58 |
| 4,539,146 | 9/1985 | Melody | 252/62.2 |
| 4,589,925 | 5/1986 | Young | 134/3 |
| 4,606,796 | 8/1986 | Hanazima | 204/42 |

OTHER PUBLICATIONS

F. A. Lowenheim, Electroplating, McGraw-Hill Book Co., New York, 1978, pp. 146–147, 452–463.
John A. Dean, Chemical Separation Methods, Van Nostrand Reinhold Co., New York, 1969, pp. 6–14.
IBM Technical Disclosure Bulletin, vol. 23, No. 8, Jan. 1981, pp. 3854–3856, A. Homola et al.

*Primary Examiner*—John F. Niebling
*Assistant Examiner*—William T. Leader
*Attorney, Agent, or Firm*—Andrea P. Bryant

[57] ABSTRACT

A process for preparing aluminum alloy substrates for use in electrical packaging includes anodizing in an aqueous bath solution containing sulfuric acid, citric acid, urea, and ammoniated colloidal silica; the latter three components being a complexing agent, a leveling agent and a stabilizing agent, respectively, so as to result in an oxide layer having an amorphous structure which eliminates the necessity of sealing thick anodic coating.

6 Claims, No Drawings

ANODIC COATINGS ON ALUMINUM FOR CIRCUIT PACKAGING

CROSS REFERENCE TO RELATED APPLICATION

This is a division of Application S/N 805, filed Jan. 15, 1988.

The instant invention is related subject matter wise to concurrently filed copending commonly assigned U.S. application Ser. No. (07/745,806).

Background Art 1. Field of the Invention.

The instant invention relates to producing thick anodic coatings on aluminum. More specifically it relates to an anodizing bath for aluminum substrates which results in substrates suitable for electronic circuit packaging applications. 2. Description of the Prior Art.

Many prior art processes are known for anodizing aluminum and its alloys. U.S. Pat. No. 3,985,629 to Kimura discloses a method for color-anodizing aluminum and its alloys, in which the anodizing takes place in an electrolytic bath including citric and sulfuric acids.

U.S. Pat. No. 3,849,264 to Weber et al discloses conventional anodizing of aluminum utilizing an aqueous electrolyte containing preferably from about 11% to 17% by weight of sulfuric acid.

U.S. Pat. No. 4,229,266 to Usbeck relates to anodically oxidizing aluminum and its alloys in an aqueous electrolyte containing sulfuric and phosphoric acids after a previous mechanical, chemical or electrochemical roughening. Sulfuric acid is present in a concentration ranging from about 25 to 150 grams per liter: phosphoric acid, ranging from about 10 to 50 grams per liter. This reference also discusses pretreatment including grinding, polishing, brushing or blast abrasion, or chemical surface treatment for degreasing, pickling or producing a matte surface or an electrochemical surface treatment by the action of an electric current in an acid. The teachings of this reference specifically are aimed at preparing materials for use as printing plate supports.

U.S. Patent 4,406,757 to Huang relates to a method of electrolytically treating lithographic grade aluminum in a sulfuric acid electrolyte where the temperature is maintained at less than about 50 degrees centigrade.

U.S. Patent 4,439,287 to Birkle et al relates to a method for anodizing aluminum in a bath having a temperature of about 0 to 15 degrees centigrade for producing an anodized layer more than 4 microns thick, which is hard and abrasion proof.

U.S. Patent 4,478,689 to Loch discloses a method an apparatus for electrolytically processing aluminum and its alloys, including means for automatically sensing the process voltage applied to the surface to be anodized and adjusting the duration of anodizing current pulses accordingly.

U.S. Patent 4,481,083 to Ball et al relates to a process for anodizing aluminum for electrolytic capacitors.

U.S. Patent 4,507,179 to Yoshida et al relates to an aluminum substrate suitable for making high-density magnetic recording media produced by anodizing a surface of the aluminum substrate in an aqueous chromic acid solution at an electrolytic voltage higher than 60 volts.

IBM TDB Vol. 23, No. 8, January, 1981, pp. 3854–3856 to Homola et al discloses use of colloidal silica to seal anodized aluminum surfaces.

None of these examples of the prior art relate to preparing by electrolytic anodization, aluminum having particular utility as substrates in the manufacture of printed circuitry. All these patents and available literature teach methods in which the anodic coating has a hybrid structure primarily of the crystalline type. The coating, particularly those with thicknesses above 25 microns, have chemical as well as mechanical flaws which render them unsuitable in circuit packaging.

Finally, while the above references are believed to be pertinent to the present invention, many patents and other prior art relate to anodizing aluminum. None however, yields the results of the present anodizing process which includes a novel anodizing bath.

SUMMARY OF THE INVENTION

The present invention relates to a process for producing thick anodic coatings on aluminum substrates, thereby rendering them suitable for use in electronic circuit packaging circuit applications. The process includes cleaning, rinsing, polishing, anodizing and rinsing steps. The preferred polishing technique is that disclosed in U.S. application Serial No. 145,806.

The primary novelty resides in the composition of the anodizing solution. The novel anodizing bath yields an amorphous structure free of voids and cracks, (mechanical flaws) while eliminating ion carriers and preventing phase transformation (chemical flaws). The bath formulation proceeds from both metallurgical and chemical considerations. Problems associated with flaws in the form of ionic carriers, voids, and stoichemistry are avoided. The above-referenced polishing bath produces microetched surfaces which increase nucleation sites, an important consideration for even anodic coatings. Utilization of urea and colloidal silica (LUDOX Trademark of E.I. duPont deNemours & Co. is a suitable material) disrupt the growth mechanism and reacts with nonstoichiometric aluminum oxide. Prior art processes produce a hybrid amorphous crystalline structure with voids and cracks. A complexing agent present in the anodic bath, citric acid, overcomes problems associated with unreacted heavy metals remaining inside the anodic coating sources for ionic carriers.

DESCRIPTION OF THE PREFERRED EMBODIMENT

The anodizing bath solution includes deionized water, sulfuric acid, a complexing agent, a leveling agent and a stabilizing agent. The electrolytic anodizing bath composition providing optimum advantages is 974 milliliters deionized water, 20 milliliters sulfuric acid, 5.5 grams citric acid as the complexing agent, 3.0 g urea as the leveling agent and 6.0 milliliters ammoniated colloidal silica as the stabilizing agent. The period for immersion in the bath varies as a function of the desired thickness T, which can be based on the average of T=15 Angstroms per second times total seconds. The bath temperature may vary between from about 5 to about 15 degrees centigrade, while the current density initially may be from about 30 to about 50 amps per square foot.

An aluminum workpiece to be anodized is made positive in the anodizing electrochemical cell containing an electrolyte solution comprising the anodizing bath of the present invention. Initial current density and cell voltage are set within 10 to 15 seconds after introducing the current by setting the voltage dial at its maximum value and gradually increasing the current until it reaches a minimum of 35 amps per square foot. Such a current density corresponds to about 30 to 35 volts. During anodizing the current decays until it reaches zero after a certain time interval, about 45 to 150 minutes, depending on the workpiece size. The voltage increases until it reaches its upper limit, a function of the equipment in use.

The preferred embodiment of the process includes cleaning aluminum workpieces in either an organic solvent such as a chlorinated solvent or in a mild alkaline solution having a pH value of 8 to 10, at a temperature in the range from about 50 to 65 degrees centigrade. This cleaning step is followed by rinsing the workpiece in deionized water.

Next, the cleaned workpiece is polished, preferably in accordance with the chemical polishing process described in the referenced copending application. The workpiece is immersed for about 2 to 3 minutes in a bath containing, per liter, 784 ml phosphoric acid, 98 ml nitric acid, 40 grams sodium nitrate, and 118 ml water, while maintaining the bath at a temperature in the range from about 80 to about 90 degrees centigrade. The polishing step is followed by a rinse step in flowing deionized water for less than a minute. The workpiece may also be rinsed by placing in flowing deionized water at a temperature in a range from about 120 to about 130 degrees fahrenheit for a period of about 1 to about 2 minutes.

Next, anodization occurs in a bath solution containing deionized water, sulfuric acid, a complexing agent, a leveling agent, and a stabilizing agent.

After anodizing, the workpiece is rinsed in flowing deionized for 2 to 3 minutes and then dried in forced air.

A particular advantage in the teaching of the present invention lies in the combination of polishing and anodizing formulations. Polishing, in accordance with the preferred embodiment produces microetched surfaces which increase nucleation sites, an important factor as it ensures even anodic coating. The anodizing bath chemistry produces anodic coatings having the following characteristics: an amorphous structure free of voids and cracks; substantial absence of ion carriers; and prevention of phase transformation. An amorphous structure free of voids and cracks, which otherwise may extend to the aluminum surface results. Known processes for anodizing produce mixed structures in the aluminum such as amorphous and crystalline, which include voids and cracks.

A primary difference between the instant invention and prior art processes lies in the utilization of leveling and stabilizing agents in the anoziding bath. The leveling agent, which in the preferred embodiment is urea, disrupts growth mechanism; and the stabilizing agent, ammoniated colloidal silica, preferably LUDOX, reacts with non-stoichiometric aluminum oxide. Two affects from using ammoniated colloidal silica are: (1) a reaction with non-stoichiometric aluminum oxide occurs and prevents phase transformations, that is aluminum oxide to aluminum hydroxide and vice versa, and (2) formation of a polymer network alumina silica, which eliminates voids and maintains the integrity of the coating during heating and cooling.

A complexing agent, preferably citric acid, reacts with the alloying elements such as copper, iron and nickel to eliminate ion carriers. When complexing agents are not used, such heavy metals remain unreacted inside the anodic coating. Subsequent voltage breakdown testing results in significant current leakage when these metals are present.

Of further note is the use of sulfuric acid in smaller amounts in the anodizing bath, preferably 2% to 3%, by weight whereas prior art processes often require 15% to 20% sulfuric acid in an anodizing bath. Such a dilute solution of sulfuric acid as taught by the instant invention prevents high dissolution rate of aluminum, thereby establishing a favorable balance between the aluminum workpiece cations and the electrolyte anions. This balance establishes dynamic equilibrium, and helps to establish electrical neutrality of the anodic coating.

A more thorough appreciation of the present invention may be had from the following examples. Most experiments were conducted on commercially available aluminum alloy 6061 having alloying metals by weight: 0.6% Si, 0.5% Fe, 1.2% Mg, 0.3% Cu, 0.2% Zn and 0.2% Ti.

Suitable anodizing equipment included a DC-power supply, a tank equipped with a copper anode, two lead cathodes, one on each side, and stainless steel cooling coils connected to a refrigeration unit to maintain the anodizing bath at a predetermined constant temperature. Air was introduced into perforated plastic tubes placed at the bottom of the anodizing tank to maintain an even level of agitation during the anodizing cycle.

The anodizing console contained an instrumentation panel at which the current, voltage, time, and air agitation were monitored and controlled. The anodizing temperature was preferably kept constant through a sensing device connecting the electrolyte with the cooling unit.

The anodizing tank was charged with electrolytes after scaling proportions up to the volume appropriate for the tank size. The cooling system was then turned on to bring the temperature to $10+/-5$ degrees centigrade. Thereafter, the anodizing bath temperature was controlled by the sensing device which automatically triggered the cooling unit whenever the temperature rose above 15 degrees centigrade. During anodization heat is generated as the oxide layer thickens.

The aluminum samples were placed on the copper anode and given a positive bias. The voltage dial was then turned to the power supply maximum output of 75 volts. Current rose slowly at first, and then quickly until a stabilized upper voltage was reached. In all trials, the current was maintained between 30 to 35 amps and the voltage between 35 and 40 volts. The anodization time was controlled with the timer, which automatically shut off the equipment at the end of a predetermined period.

Typically, both the current and voltage remained constant for the initial period of the anodization (15–20 minutes). Thereafter, the current begins to decay and the voltage continuously increases to the maximum power supply output of 75 volts. Four trial samples were intentionally kept in the anodizing bath until the current decay approached zero.

Typical anodizing time, current density, and coating thickness are shown in Table 1 for 40 samples.

TABLE 1

| | Coating Thickness Measured by an Eddy Current Technique | |
|---|---|---|
| TIME (Minutes) | CURRENT DENSITY (Amps/$Cm^2$) | COATING THICKNESS (microns) |
| 45 | 0.1 | 40 |
| 45 | 0.1 | 35 |
| 45 | 0.1 | 42 |
| 45 | 0.05 | 30 |
| 45 | 0.05 | 38 |
| 45 | 0.10 | 40 |

TABLE 1-continued

Coating Thickness Measured by an Eddy Current Technique

| TIME (Minutes) | CURRENT DENSITY (Amps/Cm$^2$) | COATING THICKNESS (microns) |
| --- | --- | --- |
| 45 | 0.10 | 42 |
| 45 | 0.10 | 48 |
| 45 | 0.10 | 43 |
| 45 | 0.05 | 40 |
| 60 | 0.10 | 60 |
| 60 | 0.10 | 55 |
| 60 | 0.10 | 69 |
| 60 | 0.05 | 48 |
| 60 | 0.05 | 55 |
| 60 | 0.05 | 46 |
| 60 | 0.10 | 70 |
| 60 | 0.10 | 70 |
| 60 | 0.05 | 58 |
| 60 | 0.10 | 65 |
| 75 | 0.05 | 72 |
| 75 | 0.10 | 85 |
| 75 | 0.10 | 80 |
| 100 | 0.05 | 125 |
| 100 | 0.01 | 120 |
| 150 | 0.10 | 150* |
| 180 | 0.10 | 175* |
| 160 | 0.10 | 150* |
| 180 | 0.10 | 170* |

*Samples left until current approached zero.

Example 1.

A total of 50 aluminum alloy 6061-T6 5 by 8 inch samples were anodized a solution having 974 milliliters deionized water, 20 milliliters sulfuric acid, 5.5 grams citric acid, 3.0 grams urea, 6.0 milliliters LUDOX AS-40. This is the basic formula which makes one liter of solution. Bath temperature was in a range of from about 5 to 10 degrees centigrade, a current density is 30 to 50 amps per square foot. Workpieces were made positive in the electrochemical cell. Examination of the samples, after anodizing, by scanning electron microscope x-ray diffraction and atomic adsorption methods followed to determine their structure and elemental compositions. Samples anodized in the inventive bath possess an amorphous structure and a balanced stoichiometry. The elemental composition of the coating consisted of aluminum, oxygen, sulfur, magnesium and silicon. Voltage breakdown testing was carried out on 30 samples and the results showed that the coating behaved like a true insulator, having a dielectric strength of 700-800 volts per mil. Example 2

Similar post anodization examinations to those in Example 1 were carried out on anodized samples obtained from prior art processes. The results revealed in all cases, conventionally anodized samples exhibit mixed structure, amorphous and crystalline, an have severe mechanical flaws in the form of large cracks and voids. There was no balanced stoichiometry. The presence of heavy ions, alloying elements, such as iron and nickel was detected. Voltage breakdown testing results showed these samples behaved as a semiconductor, having current leakage commencing at about 200 to 300 volts. Example 3

Anodization was carried out as in Example 1, with the exception that the temperature was varied between 5 to 15 degrees centigrade and the current density was varied between 0.02 to 0.05 amps per centimeter squared. (0.15 to 0.3 amps per square inch) Analytical results showed an amorphous structure balanced stoichiometry and a minimum of 700 volts per mil dielectric strength. As expected, because of higher temperature, the only difference between the samples anodized in Example 1 and Example 3 was the thickness of the anodic coating. This result is consistent with chemical kinetics where producing the anodic layer is temperature and activation energy dependent. Example 4

Sample panels of 6061-T6 aluminum alloy were anodized in a sulfuric acid and citric acid mixture at 5 degrees centigrade and 0.15 amps per square inch current density. Post anodization analysis showed mixed structure and cracks similar to the samples in Example 2. The results indicate the necessity of including leveling agents such as urea and ceramic stabilizers such as LUDOX which modify the anodic coating structure and phase transformation as described in the preferred embodiment of the bath of the instant invention. Example 5

The effect of citric acid as a complexing agent on the anodic coating elemental composition and dielectric properties was demonstrated in several experimental runs conducted on samples without citric acid in the anodizing bath. Mass ion spectroscopy and wave dispersive x-ray analysis showed the presence of heavy ions such as iron, titanium and nickel. Voltage breakdown testing revealed current leakage characteristic of ionic conduction solids. Accordingly, to obtain an anodic coating which behaves as a true insulator, the anodizing bath chemical mixture preferably includes a complexing agent which selectively removes heavy ions from the coating during anodization. Example 6

Sample panels from Examples 1, 2 and 4 were subjected to 85% relative humidity and 85 degree centigrade temperature environments. The samples which were prepared in Example 1 experienced no discoloration. Samples from Examples 2 and 4 experienced discoloration and white islands which were analytically identified as aluminum hydroxide, the result of phase transformation of aluminum oxide into aluminum hydroxide.

As earlier mentioned, the advantages of the present bath are believed to proceed from the metallurgical and chemical characteristics of the formulation. The formula establishes an order of precedence in which alternative materials may be used. Complexing agents similar to citric acid could be used. These include short to medium to long chain dicarboxylic acids, EDTA, polyphosphates and others. In addition to urea, other oxygen-rich leveling agents could be used. As an example, sugar and sugar derivatives decompose at the anode, providing leveling and oxygen. Anions of inorganic and organic polymers may be used instead of LUDOX to stabilize and/or to react with non-stoichiometric aluminum oxide.

While the invention has been described having reference to a particular anodizing bath formulation and a preferred pre-anodizing polishing step, those skilled in the art will recognize and appreciate that other polishing techniques may be used and various minor details in bath and process parameter values may be had without departing from the spirit and scope of the invention as claimed.

I claim:

1. A method of preparing aluminum alloy substrates for use in electrical packaging applications comprising the sequential steps of:
   (a) cleaning aluminum alloy workpieces;
   (b) polishing the aluminum alloy workpieces;
   (c) rinsing the polished aluminum alloy workpieces;
   (d) anodizing the aluminum alloy workpieces in an electrochemical cell in which the aluminum alloy workpieces are made positive and the cell solution comprises:

deionized water, sulfuric acid, a complexing agent, urea and ammoniated colloidal silica;

at a temperature of about 5 to about 15 degrees centigrade at a current density initially of about 30 to about 50 amps per square foot for a time determined as a function of the desired thickness in accordance with thickness = 15 Angstroms per second times seconds;

(e) rinsing the anodized aluminum alloy workpieces in flowing deionized water; and (f) drying the anodized aluminum workpieces in forced air.

2. The method of claim 1 wherein the cleaning step (a) includes immersing in a chlorinated solvent.

3. The method of claim 1 wherein the cleaning step (a) includes immersing in an alkaline solution having a pH in the range of about 8 to 10, at a temperature in the range from about 50 to about 65 degrees centigrade, and rinsing in water.

4. The method of claims 1,2 or 3 wherein the polishing step (b) comprises:

immersing the workpieces for about 2 to 3 minutes in a bath containing, per liter, 784 ml phosphoric acid, 98 ml nitric acid, 40 grams sodium nitrate, and 118 ml water, while said bath is maintained at a temperature in the range from about 80 to about 90 degrees centigrade.

5. The method of claim 1 wherein the rinsing step (c) comprises:

placing the workpieces in flowing deionized water at a temperature in a range from about 120 to about 130 degrees fahrenheit for a period of about 1 to about 2 minutes.

6. The method of claim 1 wherein the anodizing step (d) includes a cell solution containing per liter:

974 ml deionized water, 20 ml sulfuric acid, 5.5 grams complexing agent, 3.0 grams urea and 6.0 ml ammoniated colloidal silica.

* * * * *